(12) United States Patent
Ozeki

(10) Patent No.: US 9,231,322 B2
(45) Date of Patent: Jan. 5, 2016

(54) BOARD-CONNECTING ELECTRICAL CONNECTOR DEVICE

(71) Applicant: DAI-ICHI SEIKO CO., LTD., Kyoto-shi (JP)

(72) Inventor: Kosuke Ozeki, Fukuoka (JP)

(73) Assignee: DAI-ICHI SEIKO CO., LTD., Kyoto-shi (JP)

( * ) Notice: Subject to any disclaimer, the term of this patent is extended or adjusted under 35 U.S.C. 154(b) by 0 days.

(21) Appl. No.: 14/474,720

(22) Filed: Sep. 2, 2014

(65) Prior Publication Data

US 2015/0079818 A1 Mar. 19, 2015

(30) Foreign Application Priority Data

Sep. 19, 2013 (JP) .................................. 2013-194689

(51) Int. Cl.
*H01R 12/73* (2011.01)
*H01R 13/627* (2006.01)
*H05K 1/00* (2006.01)

(52) U.S. Cl.
CPC ............ *H01R 12/73* (2013.01); *H01R 13/6275* (2013.01); *H05K 1/00* (2013.01)

(58) Field of Classification Search
CPC ............................... H01R 23/725; H01R 9/096
See application file for complete search history.

(56) References Cited

U.S. PATENT DOCUMENTS

| | | | | |
|---|---|---|---|---|
| 6,645,005 B2* | 11/2003 | Wu | ...................... | H01R 12/707 439/563 |
| 7,845,958 B2* | 12/2010 | Hoshino | .............. | H01R 12/716 439/660 |
| 8,083,527 B2* | 12/2011 | Takeuchi | ............... | H01R 13/26 439/65 |
| 8,292,635 B2* | 10/2012 | Little | .................. | H01R 12/7029 439/570 |
| 8,961,215 B2* | 2/2015 | Hasegawa | .............. | H01R 9/091 439/346 |
| 2005/0026466 A1* | 2/2005 | Kubo | ................. | H01R 13/6275 439/74 |

FOREIGN PATENT DOCUMENTS

| | | |
|---|---|---|
| JP | 3-266380 | 11/1991 |
| JP | 5-2385 U | 1/1993 |
| JP | 2007-109522 | 4/2007 |
| JP | 2011-65861 A | 3/2011 |

OTHER PUBLICATIONS

Office Action issued Jun. 24, 2015 in Korean Patent Application No. 10-2014-0094730.

* cited by examiner

*Primary Examiner* — Gary Paumen
(74) *Attorney, Agent, or Firm* — Oblon, McClelland, Maier & Neustadt, L.L.P.

(57) ABSTRACT

The operation of a lock member and the check thereof are easily and reliably enabled with a simple configuration while achieving downsizing. When a movable lock engagement part is moved along a lock guide part in a state in which a fixed lock latch part provided on either one of first and second electrical connectors is in an arrangement relation that the fixed lock latch part is overlapped with the lock guide part provided on the other one in a mating direction, the movable lock engagement part is engaged with or released from the fixed lock latch part. An operation of engaging or releasing the movable lock engagement part with/from the fixed lock latch part is carried out in a state in which the operation can be visually checked through a housing-operation opening and facing the electrical connectors.

7 Claims, 20 Drawing Sheets

(a)

(b)

(a)

(b)

BOARD-CONNECTING ELECTRICAL CONNECTOR DEVICE

BACKGROUND OF THE INVENTION

1. Field of the Invention

The present invention relates to a board-connecting electrical connector device that is interposed between a pair of wiring boards to electrically connect the wiring boards with each other.

2. Description of Related Art

Generally, in various electrical devices, for example, a board-connecting electrical connector device referred to as a stacking connector that electrically connects a pair of wiring boards with each other is widely employed. The electrical connector device of this type electrically connects first and second wiring boards with each other by mating the first electrical connector to which the first wiring board is coupled and the second electrical connector to which the second wiring board is coupled; wherein lock members for reliably maintaining the mutually mated state of the first and second electrical connectors are provided in some cases. For example, in an electrical connector device described in Japanese Patent Application Laid-Open No. H3-266380, lock members provided on lateral-wall parts of main-body parts of first and second electrical connectors are slid to obtain an engaged state, thereby maintaining the mutually mated state of the first and second electrical connectors.

However, the lock members used in the conventional board-connecting electrical connector device are disposed on the lateral-wall parts of the connector main-body parts consisting of, for example, insulating housings. Therefore, the lock members are sometimes hidden between the wiring boards. Particularly in recent downsized/height-reduced electrical connector devices, it is difficult to operate engagement/release of the lock members; and, since the operation of engagement/release of the lock members cannot be visually checked, there is also a problem that it is difficult to check the lock state. Moreover, since the lock members are structured to project outward from the connector main-body parts, there is a tendency that the size of the whole connector is increased.

The inventors of the present application discloses below Patent Literature as a conventional technique of the invention of the present application.

[Patent Literature 1] Japanese Patent Application Laid-Open No. 1992(H03)-266380

BRIEF SUMMARY OF THE INVENTION

Therefore, it is an object of the present invention to provide a board-connecting electrical connector device that easily enables an operation for engaging or releasing lock members in a visually-checkable state with a simple configuration and enables downsizing.

In order to achieve the above described object, the present invention employs a configuration of a board-connecting electrical connector device for mutually mating a first electrical connector to which a first wiring board is coupled and a second electrical connector to which a second wiring board is coupled to electrically connect the first and second wiring boards with each other, the board-connecting electrical connector device configured to maintain the first and second electrical connectors in a mutually mated state by mutually engaging lock members provided on insulating housings of the first and second electrical connectors; wherein the lock member of either one of the first and second electrical connectors has a lock guide part provided on the insulating housing and a movable lock engagement part attached to the lock guide part so as to be able to reciprocate; the lock member of the other one of the first and second electrical connectors has a fixed lock latch part attached to the insulating housing; the fixed lock latch part has an arrangement relation that, when the first and second electrical connectors are mutually mated, the fixed lock latch part is overlapped with the lock guide part in the direction of the mating; the movable lock engagement part is configured to be engaged or released with/from the fixed lock latch part when the movable lock engagement part is moved along the lock guide part from the state in which the fixed lock latch part is overlapped with the lock guide part; and at least one of the insulating housings of the first and second electrical connectors is provided with a housing-operation opening that brings the movable lock engagement part into an exposed state toward the outer side of the mating direction.

According to the board-connecting electrical connector device provided with such a configuration, the operation for engaging or releasing the movable lock engagement part of the lock member with/from the fixed lock latch part is carried out in a state in which it faces the electrical connector which can be visually seen through the housing-operation opening provided on the insulating housing. Therefore, the operation of the lock member and the check thereof can be easily reliably carried out.

It is desired that at least one of the first and second wiring boards of the present invention be provided with a board-operation opening that brings the movable lock engagement part into an exposed state toward the outer side of the mating direction.

According to the board-connecting electrical connector device provided with such a configuration, the operation for engaging or releasing the movable lock engagement part of the lock member with/from the fixed lock latch part is carried out in a state in which it faces the electrical connector which can be visually seen through the board-operation opening provided on the wiring board. Therefore, the operation of the lock member and the check thereof can be easily reliably carried out.

It is desired that the movable lock engagement part of the present invention be disposed in an inner side of a region in which the electrical connector is mounted with respect to the wiring board.

According to the board-connecting electrical connector device provided with such a configuration, the lock member including the movable lock engagement part does not stick out from the mounted region of the electrical connector. Therefore, the electrical connector can be reliably downsized.

It is desired that, in the present invention the first and second electrical connectors be provided with a pair of electrode rows consisting of a plurality of contact members aligned in a multipolar manner, and the movable lock engagement part be disposed between the pair of electrode rows.

According to the board-connecting electrical connector device provided with such a configuration, the lock member including the movable lock engagement part does not stick out from the region in which the electrode rows are disposed. Therefore, the electrical connector can be reliably downsized.

In the present invention, it is desired that the fixed lock latch part and the movable lock engagement part be formed by thin-plate-shaped metal members; and the movable lock engagement part and the fixed lock latch part be provided with mating detection parts consisting of concave/convex parts mutually mated upon the engagement.

According to the board-connecting electrical connector device provided with such a configuration, when the movable lock engagement part of the lock member is engaged with or released from the fixed lock latch part, the concave/convex parts of the mating detection parts are mated with each other. Therefore, a so-called click feeling of the mating is obtained, and operability is improved.

It is desired that the movable lock engagement part of the present invention be configured to be moved along a longitudinal direction of the first and second electrical connectors.

According to the board-connecting electrical connector device provided with such a configuration, the operation of engaging or releasing the movable lock engagement part of the lock member with/from the fixed lock latch part is easily carried out along the longitudinal direction of the electrical connector having spatial allowance.

In the present invention, it is desired that a moving range of the movable lock engagement part be regulated by a positioning part integrally formed with the insulating housing so as to be elastically displaceable in the mating direction.

According to the board-connecting electrical connector device provided with such a configuration, the movable lock engagement part is attached to the lock guide part when the movable lock engagement part is moved along the lock guide part in the state in which the movable lock engagement part presses and elastically displaces the positioning part in the mating direction, and the movement of the movable lock engagement part is regulated by the positioning part when the positioning part is elastically returned to the original position after the movable lock engagement part is attached.

As described above, the board-connecting electrical connector device according to the present invention employs the configuration in which: the movable lock engagement part is engaged or released with/from the fixed lock latch part when the movable lock engagement part is moved along the lock guide part in the state in which the fixed lock latch part provided on either one of the first and second electrical connectors is in the arrangement relation that it is overlapped with the lock guide part provided on the other one in the mating direction when the first and second electrical connectors are mutually mated; and the operation of engaging or releasing the movable lock engagement part of the lock member with/from the fixed lock latch part is carried out in the state in which it can be visually checked through the housing-operation opening and faces the electrical connector since the housing-operation opening which brings the movable lock engagement part into an exposed state is provided on at least one of the insulating housings of the first and second electrical connectors. Therefore, the operation of the lock member and the check thereof can be easily reliably carried out with the simple configuration, and reliability can be significantly increased at low cost while downsizing the board-connecting electrical connector device.

BRIEF DESCRIPTION OF THE DRAWINGS

FIGS. 6A and 6B show a standby state (unlocked state) of a lock member used in the first electrical connector (receptacle connector) shown in FIG. 1 to FIG. 5; wherein FIG. 6A is an external-appearance perspective explanatory view seen from the connector outer side, and FIG. 6B is an external-appearance perspective appearance view seen from the connector inner side;

FIGS. 7A and 7B show the structure of a movable lock engagement part used in the first electrical connector (receptacle connector) shown in FIG. 1 to FIG. 5; wherein FIG. 7A is an external-appearance perspective explanatory view seen from the upper side of the connector outer side, and FIG. 7B is an external-appearance perspective explanatory view seen from the lower side of the connector outer side;

FIGS. 10A and 10B show the operated state (locked state) of the lock member used in the first electrical connector (receptacle connector) shown in FIG. 1 to FIG. 5; wherein FIG. 10A is an external-appearance perspective explanatory view seen from the connector outer side, and FIG. 7B is an external-appearance perspective explanatory view seen from the connector inner side;

DETAILED DESCRIPTION OF THE INVENTION

Figure 1:
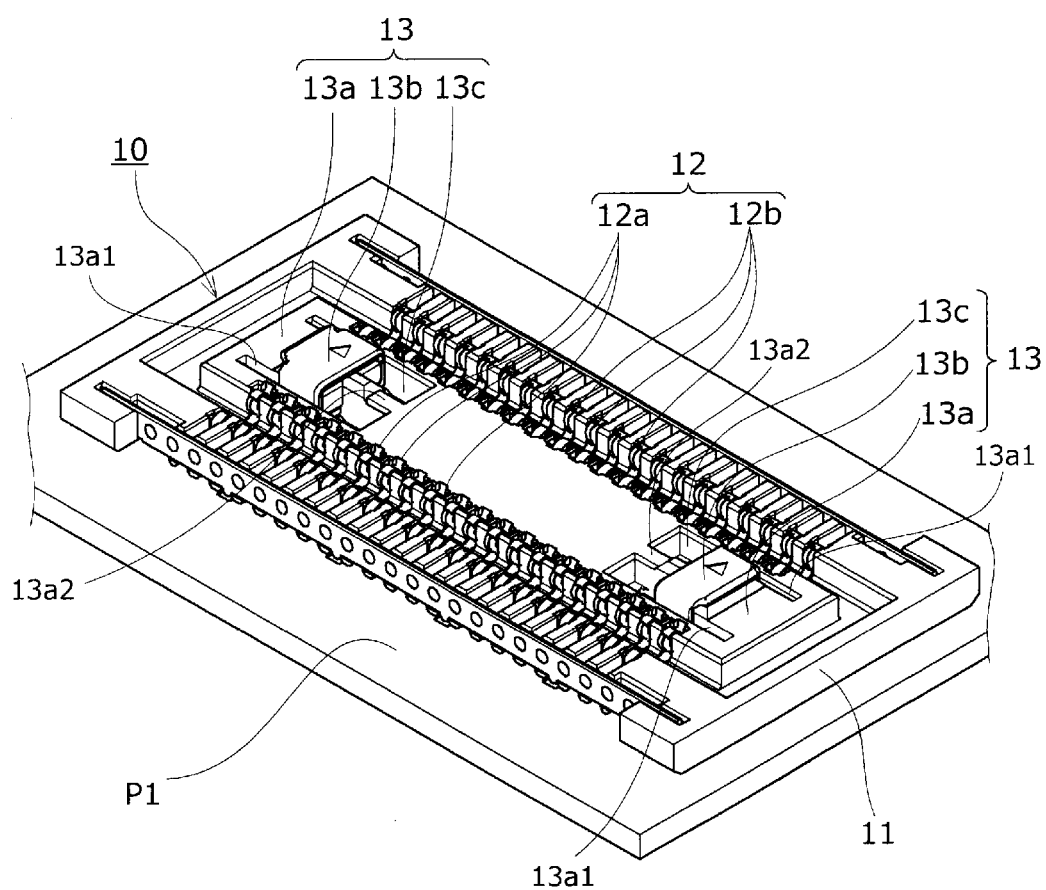
FIG. 1 is an external-appearance perspective explanatory view showing a first electrical connector (receptacle connector) according to an embodiment of the present invention from the upper side.
Figure 2:
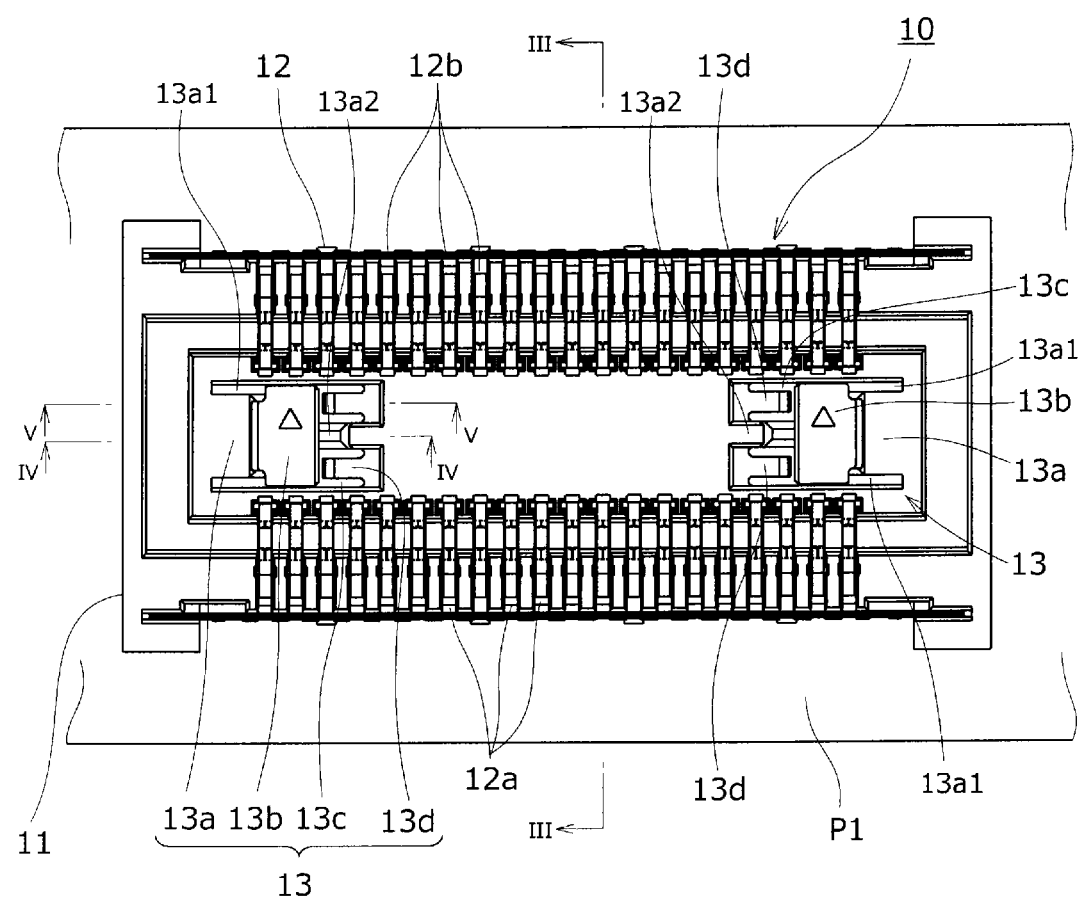
FIG. 2 is an explanatory plan view showing the first electrical connector (receptacle connector) according to the embodiment of the present invention shown in FIG. 1.
Figure 3:
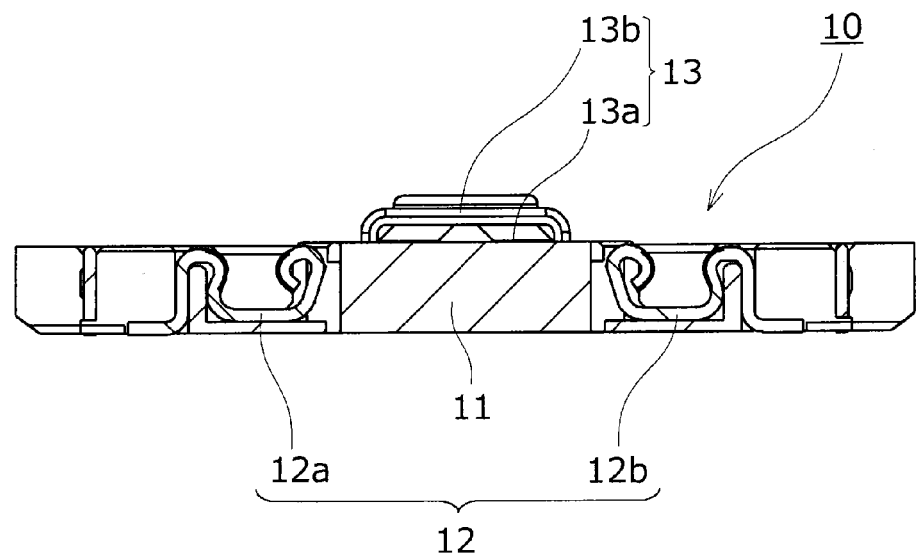
FIG. 3 is an explanatory transverse cross-sectional view taken along a line III-III in FIG. 1.
Figure 4:
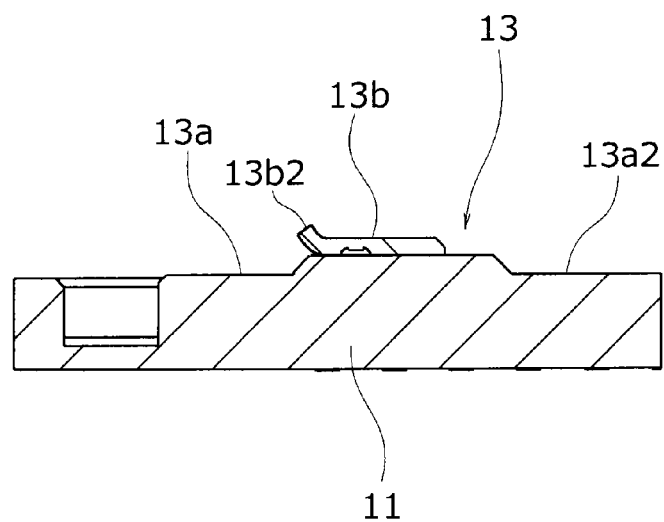
FIG. 4 is an explanatory transverse cross-sectional view taken along a line IV-IV in FIG. 1.
Figure 5:
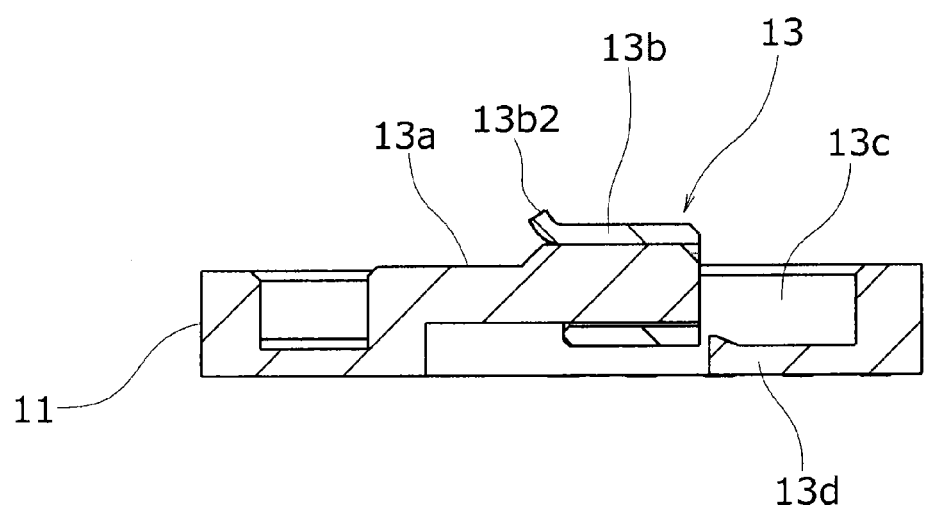
FIG. 5 is an explanatory transverse cross-sectional view taken along a line V-V in FIG. 1.
Figure 6:
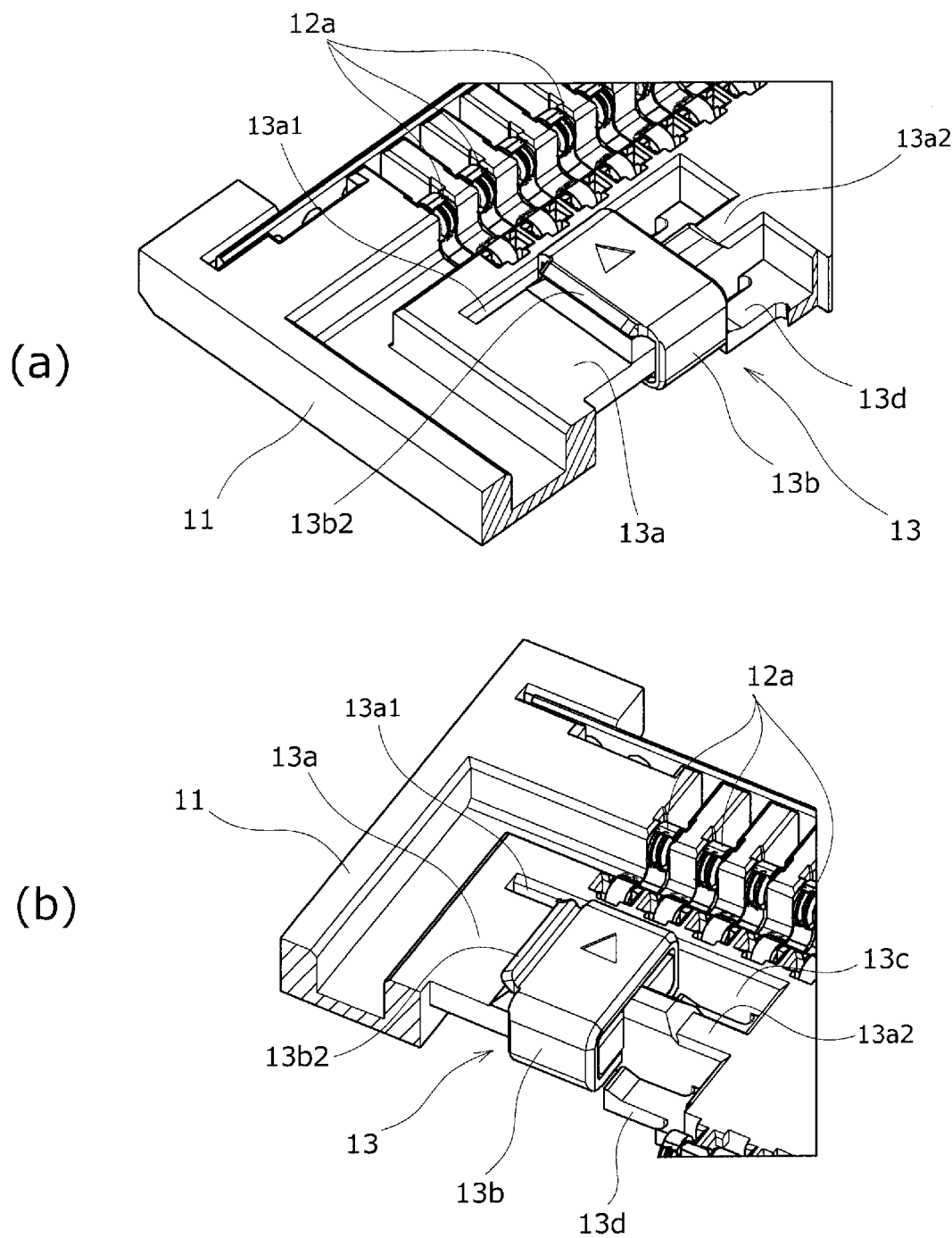

Hereinafter, an embodiment of the present invention applied to a board-connecting electrical connector device, which connects printed wiring boards to each other, will be explained in detail based on drawings.

[About Overall Structure of Electrical Connector Device]

A board-connecting electrical connector device according to an embodiment of the present invention shown in the drawings electrically connects printed wiring boards, which are disposed in an electronic device such as a mobile phone, to each other, and consists of a receptacle connector 10 serving as a first electrical connector shown in FIG. 1 to FIG. 10 and a plug connector 20 serving as a second electrical connector shown in FIG. 11 to FIG. 16. In a state that the receptacle connector (first electrical connector) 10 is mounted on a first wiring board P1 and that the plug connector (second electrical connector) 20 is mounted on a second wiring board P2, when the receptacle connector 10 and the plug connector 20 are mated with each other, electrical connection between the first and second wiring boards P1 and P2 is established.

Figure 17:
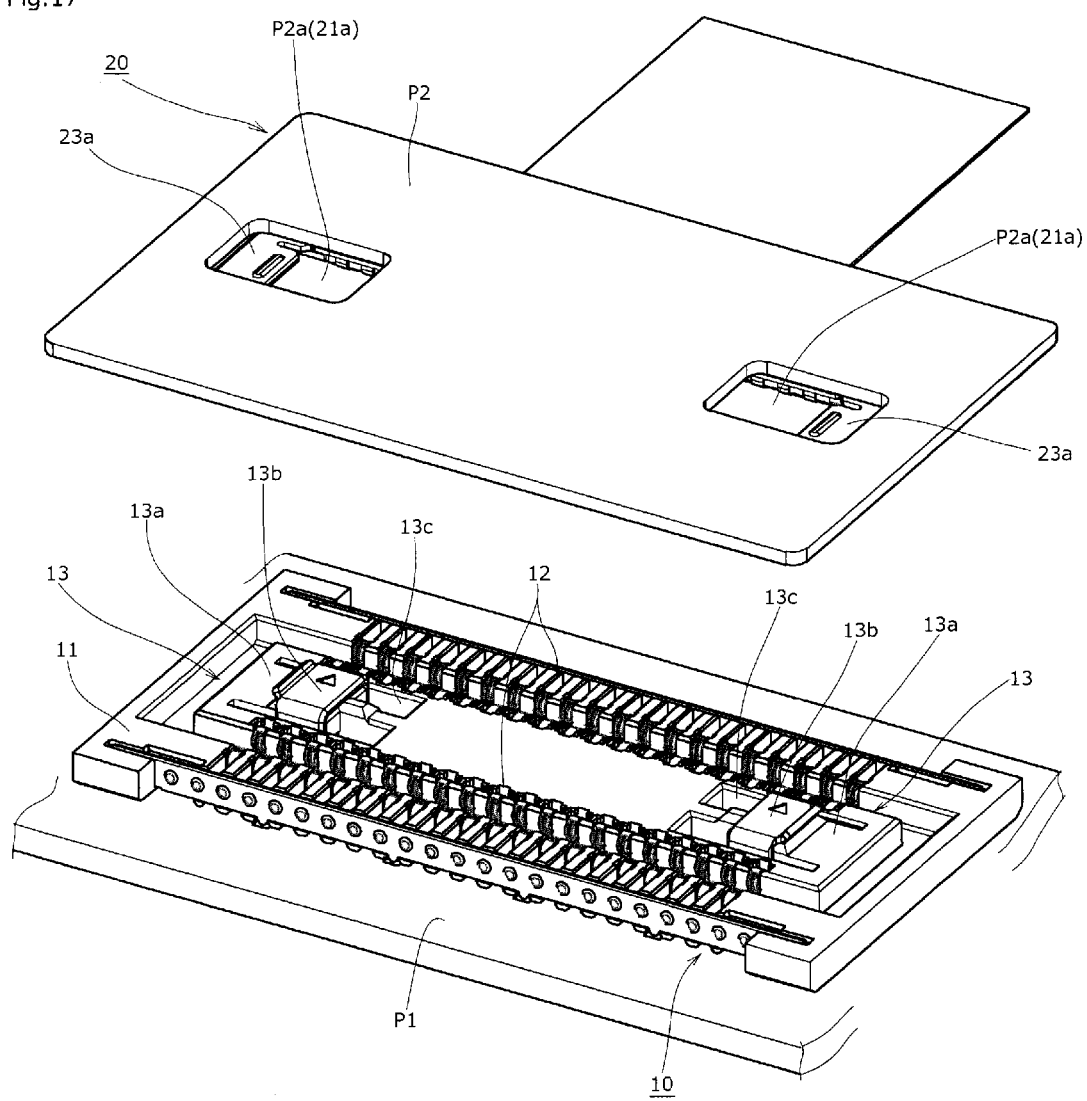
FIG. 17 is an external-appearance perspective explanatory view showing the state in which the second electrical connector (plug connector) is disposed to be opposed at the position above the first electrical connector (receptacle connector)
Figure 18:
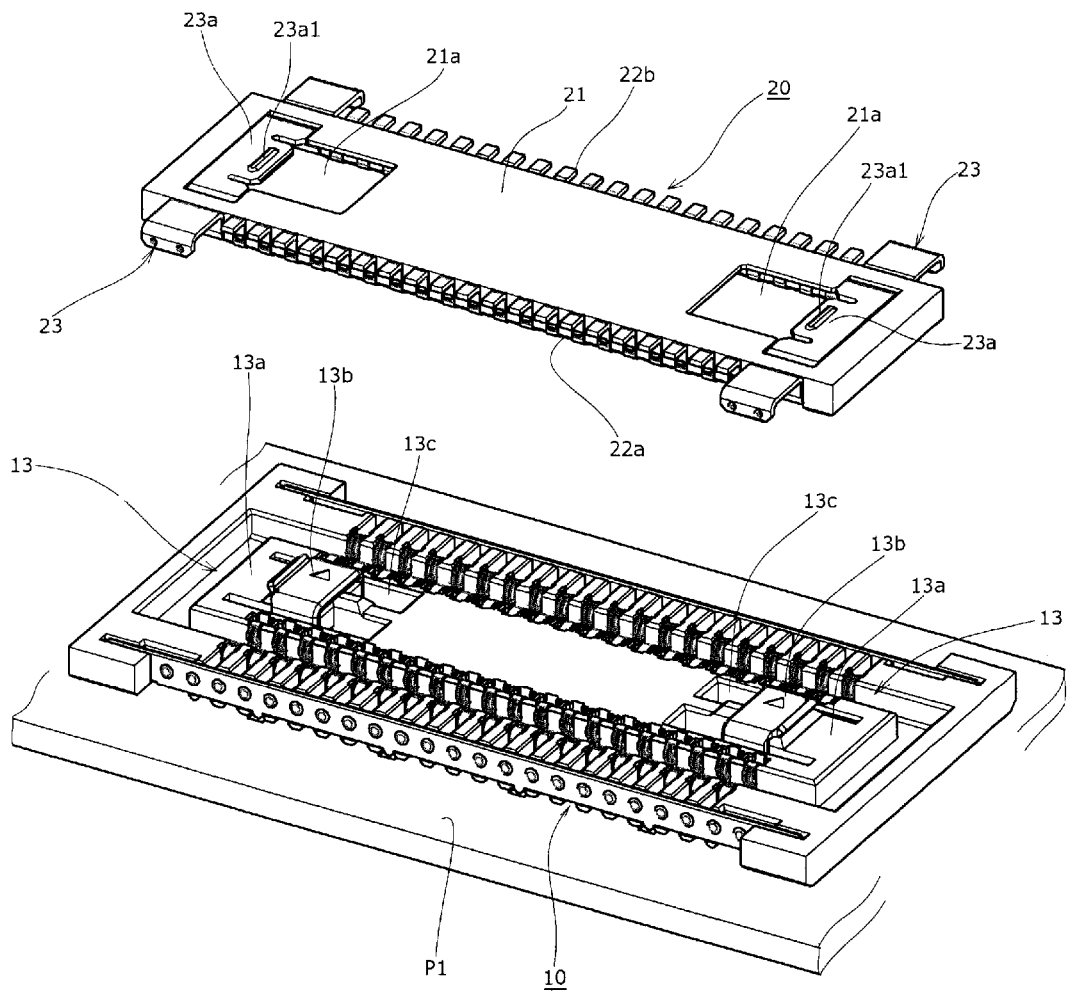
FIG. 18 is an external-appearance perspective explanatory view showing FIG. 17 from which the second wiring board on which the second electrical connector (plug connector) is mounted is omitted.
Figure 19:
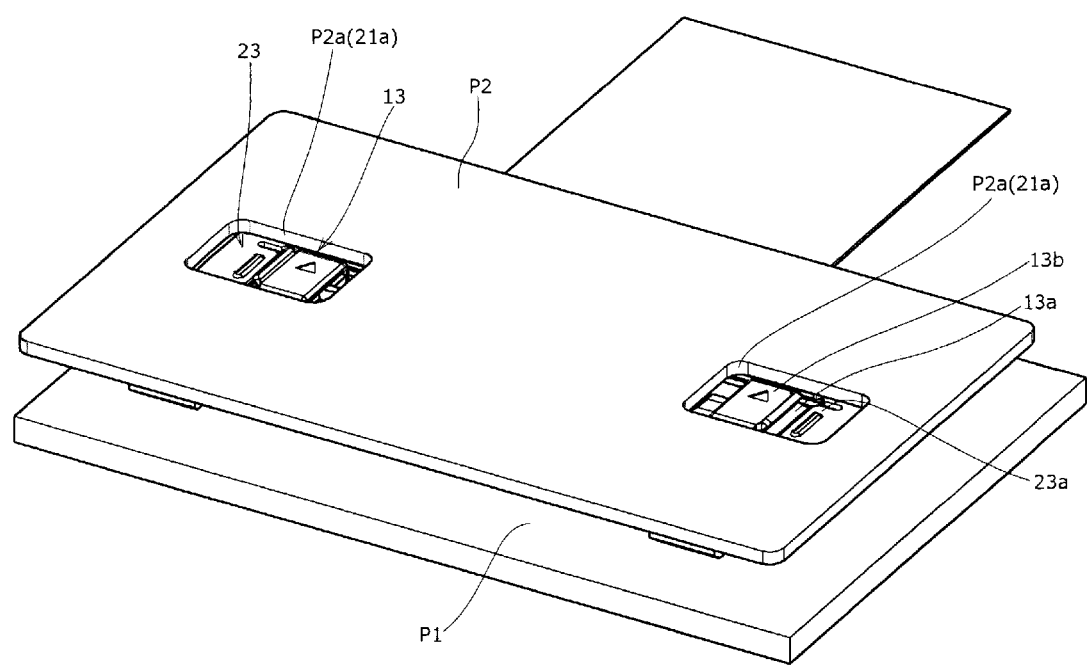
FIG. 19 is an external-appearance perspective explanatory view showing an unlocked state immediately after the second electrical connector (plug connector) is moved down and mated with the first electrical connector (receptacle connector) from the opposed state shown in FIG. 17.
Figure 20:
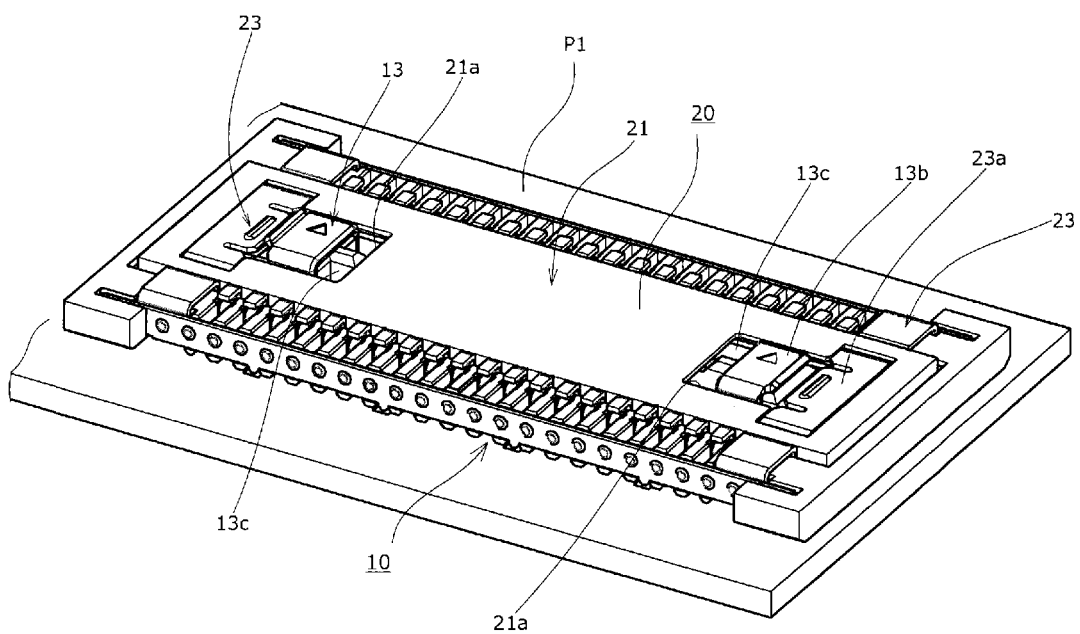
FIG. 20 is an external-appearance perspective explanatory view showing FIG. 19 from which the second wiring board on which the second electrical connector (plug connector) is mounted is omitted.
Figure 21:
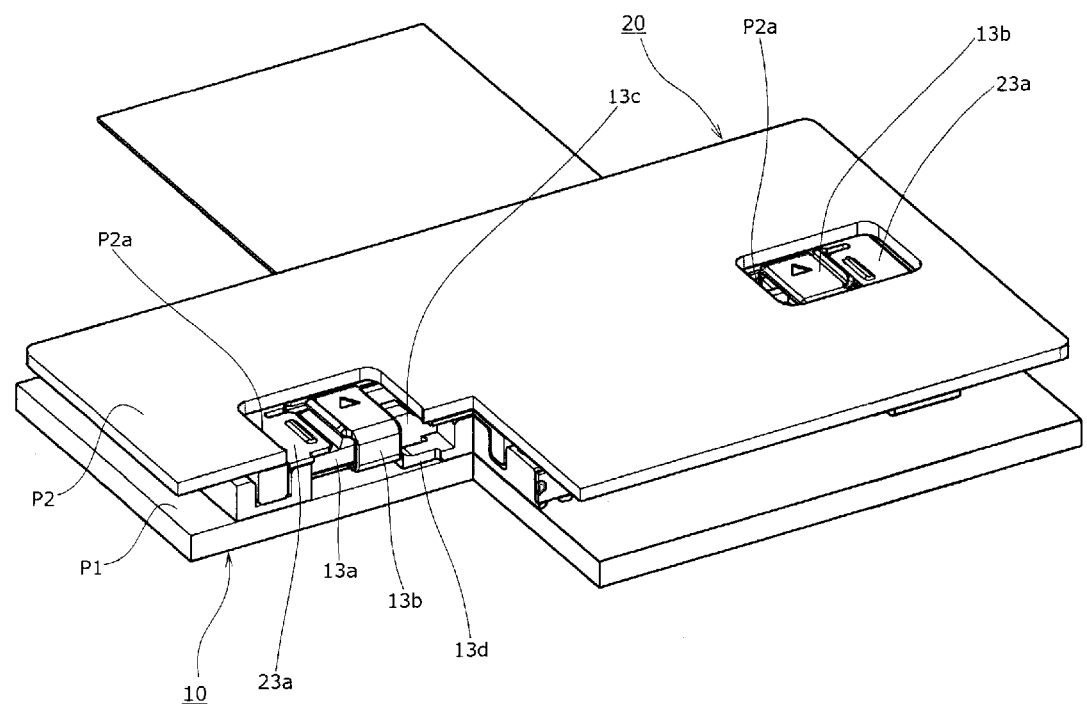
FIG. 21 is an external-appearance perspective explanatory view showing the first and second wiring boards of FIG. 19, which are partially cut away.
Figure 22:
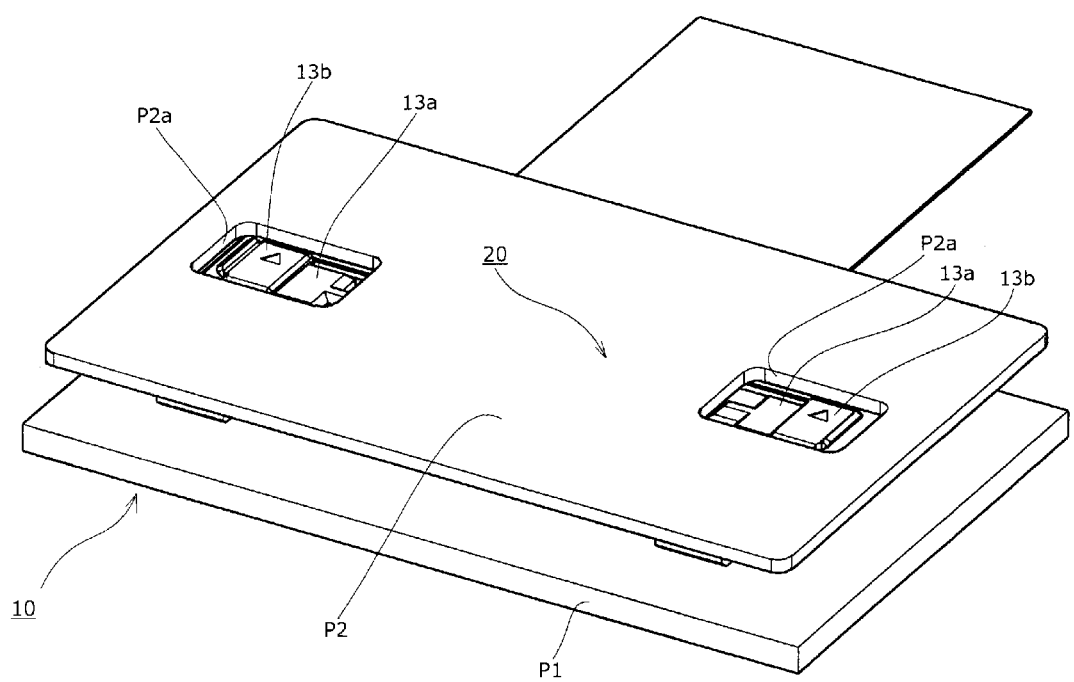
FIG. 22 is an external-appearance perspective explanatory view showing the locked state, which is obtained by carrying out a lock operation from the unlocked state shown in FIG. 19.
Figure 23:
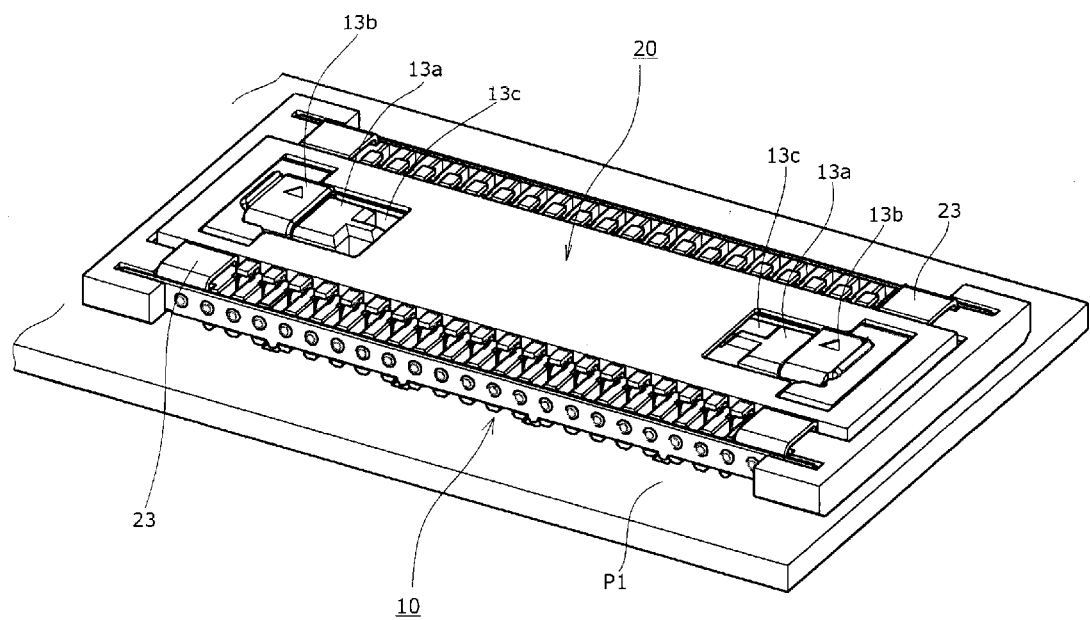
FIG. 23 is an external-appearance perspective explanatory view showing FIG. 22 from which the second wiring board on which the second electrical connector (plug connector) is mounted is omitted.
Figure 24:
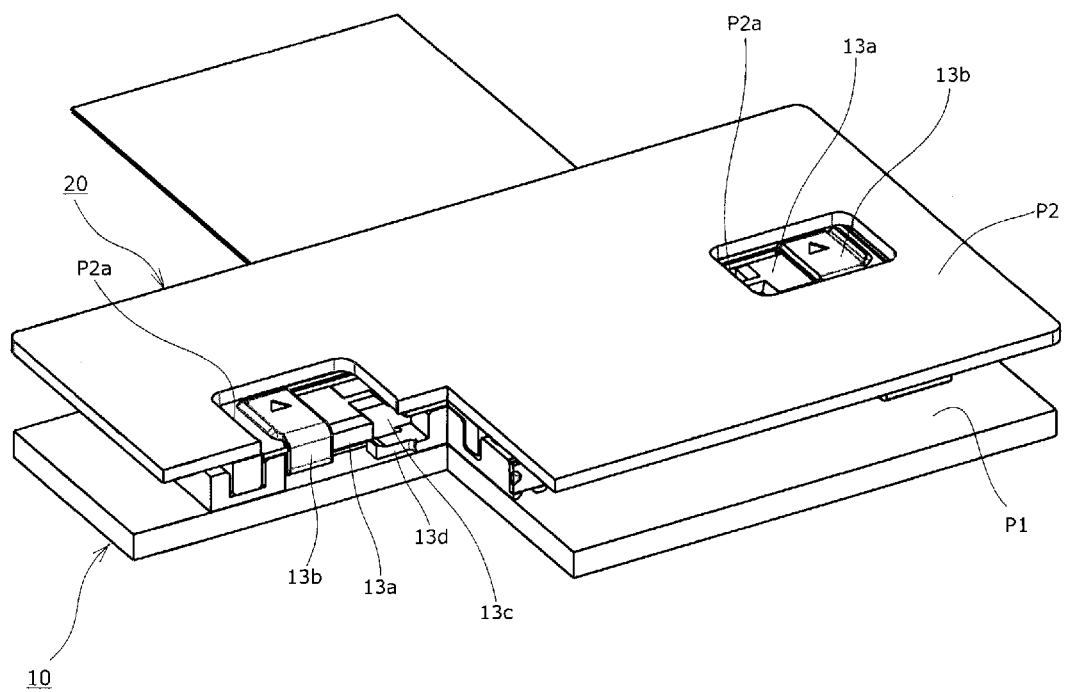
FIG. 24 is an external-appearance perspective explanatory view showing the first and second wiring boards of FIG. 22, which are partially cut away.

In the below explanations, the mating direction of the receptacle connector 10 and the plug connector 20 is assumed to be a "top-bottom direction". The plug connector 20 is disposed above the receptacle connector 10, which is disposed in the lower side, as shown in FIG. 17 and FIG. 18; and, when the plug connector 20 is pushed in a downward direction from this state, both of the connectors 10 and 20 are mated with each other as shown in FIG. 19 to FIG. 21. The plug connector 20 is configured to be removed from the receptacle connector 10 when the plug connector 20 is pulled upward with appropriate force from the mated state.

An operation of mating/removing the plug connector 20 with/from the above described receptacle connector 10 is not limited to be carried out by the hand(s) of an operator, but may be configured to be automatically carried out by a predetermined jig or machine.

[About Structure of Electrical Connectors]

The receptacle connector (first electrical connector) 10 and the plug connector (second electrical connector) 20 have flat-plate-frame-shaped insulating housings 11 and 21 having an approximately rectangular shape in a plane (rectangular shape). The insulating housings 11 and 21 are, for example, formed by molding by using a resin material such as plastic, and many contact members 12 and 22 are aligned so as to form multipolar shapes along the longitudinal direction of the insulating housings 11 and 21. Hereinafter, the longitudinal direction of the insulating housings 11 and 21 will be referred to as "connector longitudinal direction", and the direction orthogonal to the "connector longitudinal direction" will be referred to as "connector front-back direction".

As described above, the contact members 12 and 22 are aligned in a multipolar manner in the "connector longitudinal direction" and, more specifically, have two electrode rows 12a, 12b and 22a, 22b, correspondingly. The two electrode rows 12a, 12b and 22a, 22b are juxtaposed so as to extend approximately in parallel along the "connector longitudinal direction". The electrode rows 22a and 22b in the contact-member-22 side are in the relation that they are mutually elastically mated with the electrode rows 12a and 12b in the contact-member-12 side when both of the connectors 10 and 20 are mated with each other.

On the other hand, the receptacle connector 10 and the plug connector 20, which have been brought into a mated state in the above described manner, are configured to maintain the mated state by lock members 13 and 23, which will be explained below. Pairs of the lock members 13 and 23 are disposed at both-side parts of the "connector longitudinal direction", respectively, and are disposed in the inner side of the regions in which the receptacle connector 10 and the plug connector 20 are mounted on the first and second wiring boards P1 and P2.

More specifically, the lock members 13 and 23 are disposed in the region in the inner side of the insulating housings 11 and 21. In the receptacle connector 10, the lock members 13 are disposed in the parts between the electrodes of the pair of electrode rows 12a and 12b constituting the contact members 12. In the plug connector 20, the lock members 23 are disposed in the parts between the electrodes of the pair of electrode rows 22a and 22b constituting the contact members 22.

The lock members 13 and 23 have mutually symmetrical structures and arrangement relations in the connector-longitudinal-direction both-side parts. Therefore, in the below explanations, one of them will be explained, and the explanation of the other will be omitted.

[About Lock Members of Receptacle Connector]

First, the lock member 13 provided on the receptacle connector 10 serving as the first electrical connector shown in FIG. 1 to FIG. 10 has a lock guide part 13a consisting of a shaft-like member integrally formed with the insulating housing 11, and a movable lock engagement part 13b is slidably attached to the lock guide part 13a. The lock guide part 13a thereof is formed in the part between a pair of sliding slit parts 13a1 and 13a1, which are extended approximately in parallel with the "connector longitudinal direction", and is formed by the shaft-like member extending in the "connector longitudinal direction" to form an approximately rectangular shape in a transverse cross section in the part between the sliding slit parts 13a1 and 13a1. The movable lock engagement part 13b attached so as to straddle the lock guide part 13a is assembled so as to be able to reciprocate in the "connector longitudinal direction" along the lock guide part 13a and the sliding slit parts 13a1 and 13a1 in both sides thereof.

Figure 7:
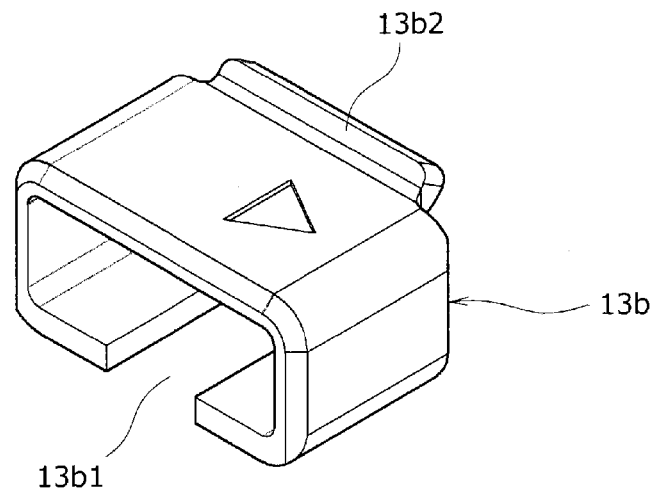
Figure 7:
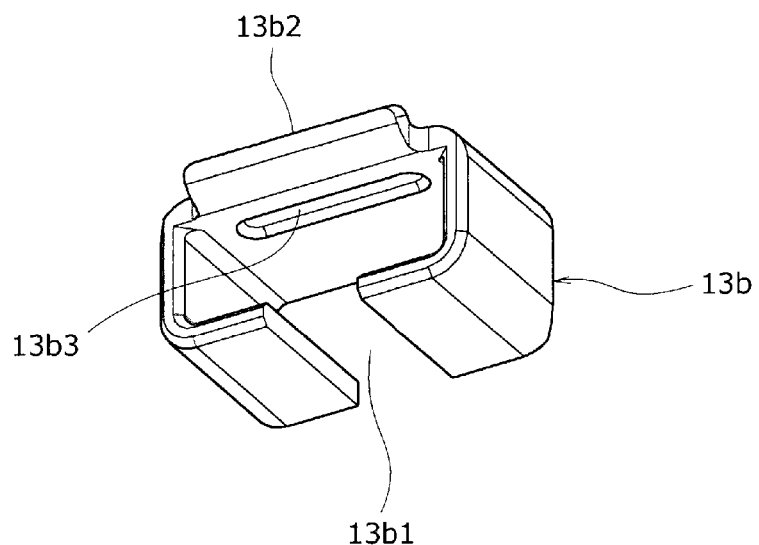
Figure 8:
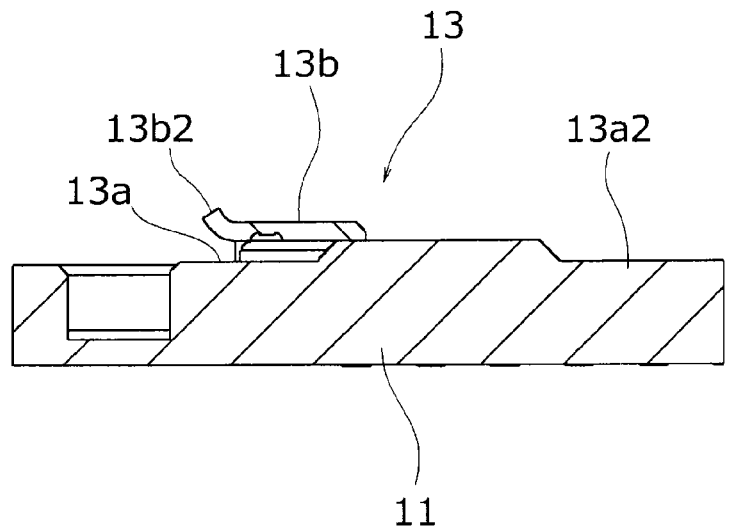
FIG. 8 is an explanatory transverse cross-sectional view corresponding to FIG. 4 showing an operated state (locked state) of the lock member used in the first electrical connector (receptacle connector) shown in FIG. 1 to FIG. 5.
Figure 9:
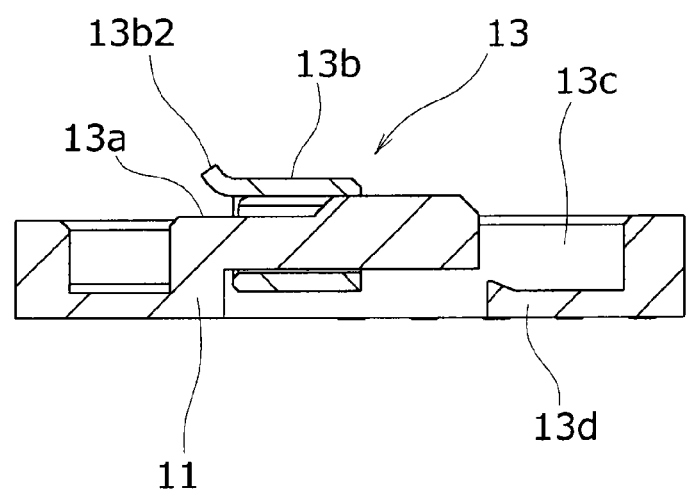
FIG. 9 is an explanatory transverse cross-sectional view corresponding to FIG. 5 showing the operated state (locked state) of the lock member used in the first electrical connector (receptacle connector) shown in FIG. 1 to FIG. 5.
Figure 10:
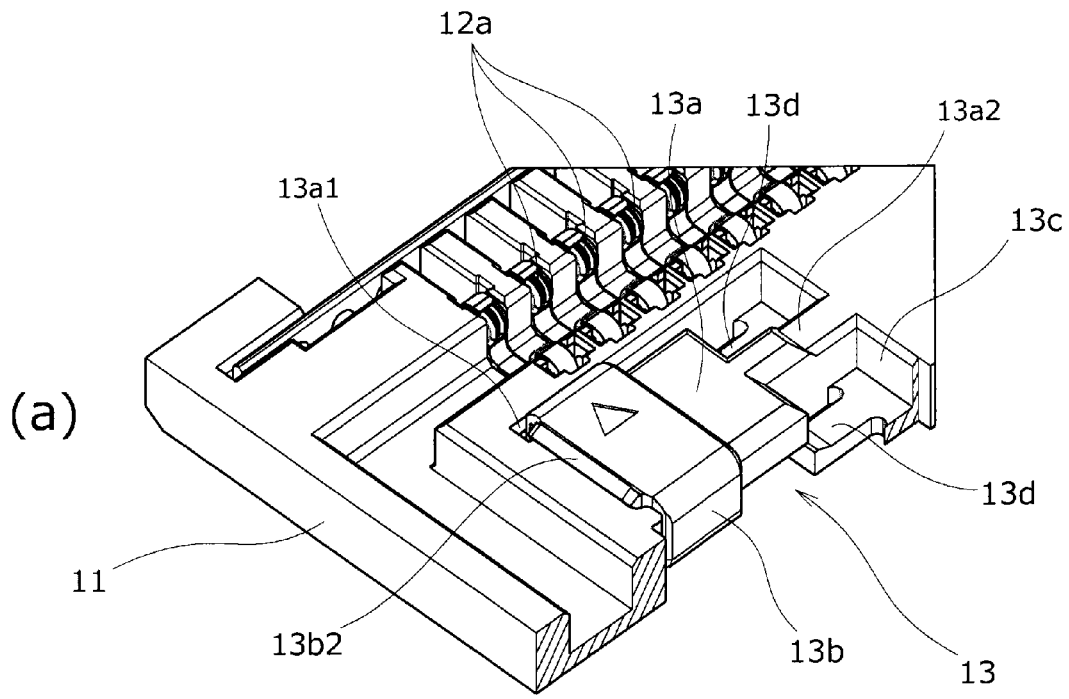
Figure 10:
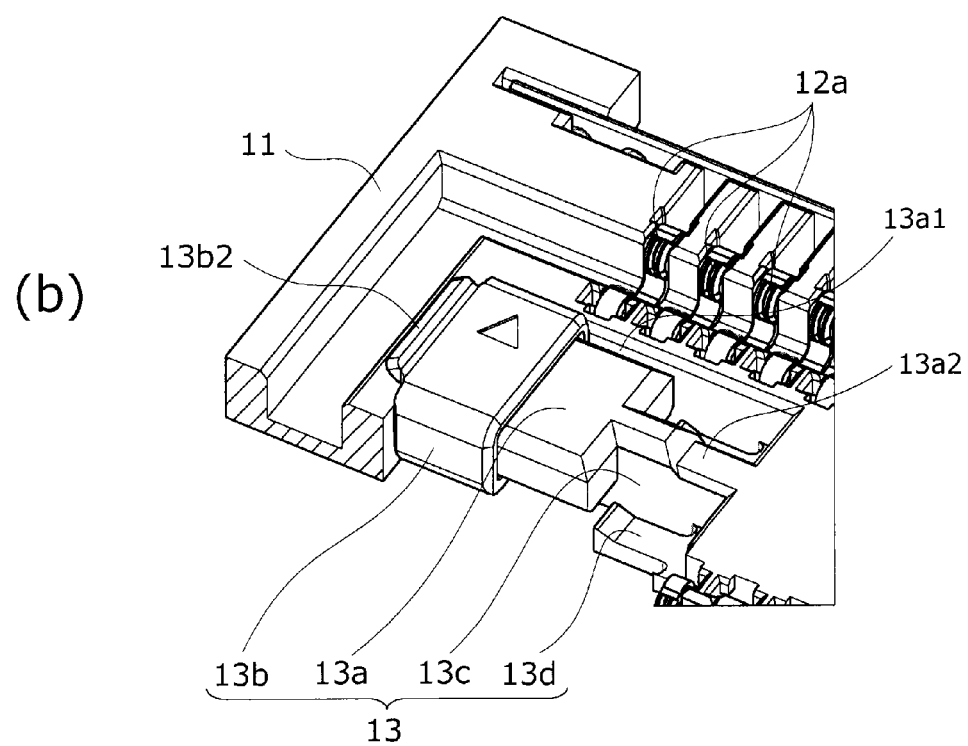
Figure 11:
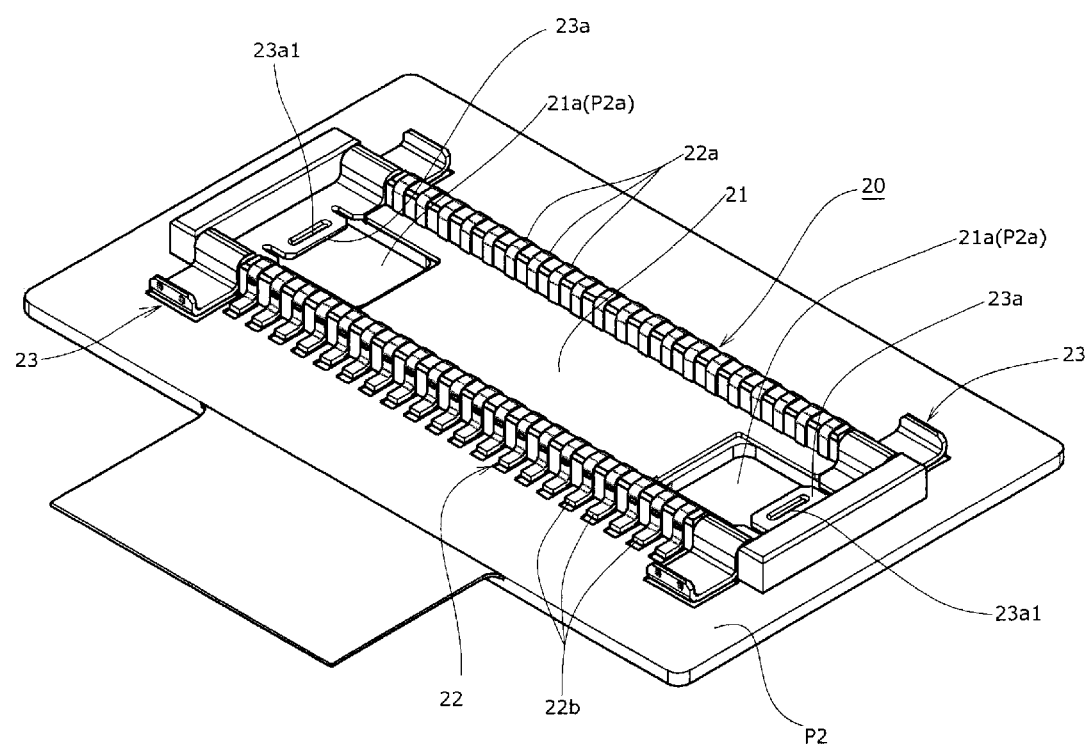
FIG. 11 is an external-appearance perspective explanatory view showing a second electrical connector (plug connector) according to the embodiment of the present invention from the upper side.
Figure 12:
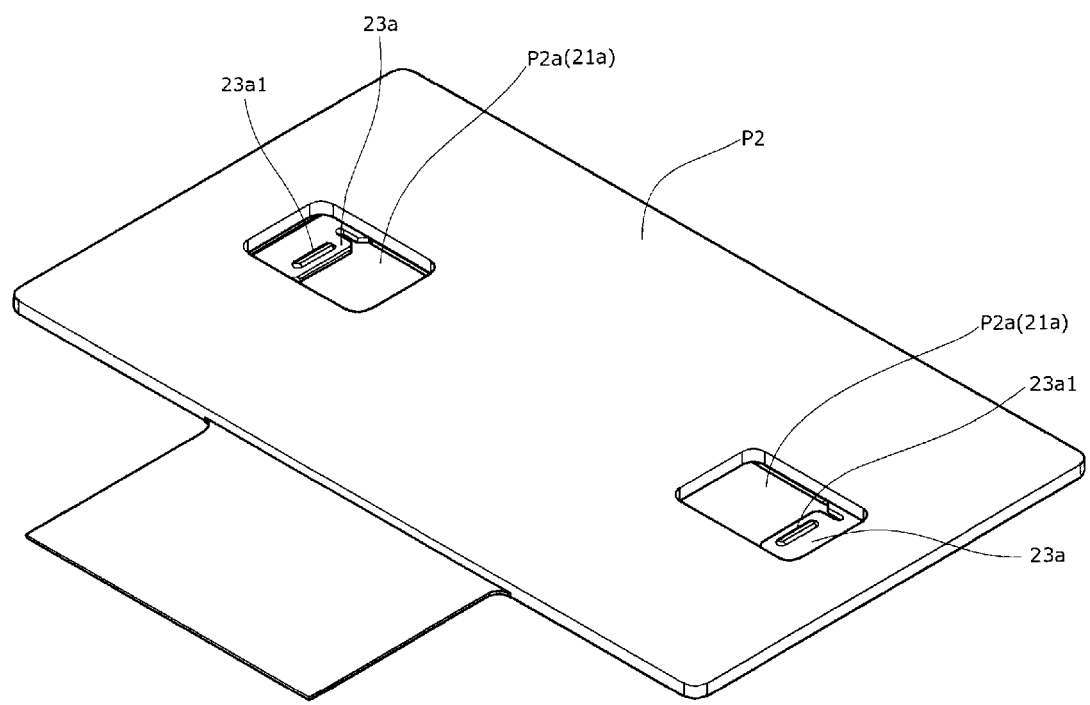
FIG. 12 is an external-appearance perspective explanatory view showing a state in which the second electrical connector (plug connector) according to the embodiment of the present invention shown in FIG. 11 is vertically reversed and opposed to the first electrical connector (receptacle connector)
Figure 13:
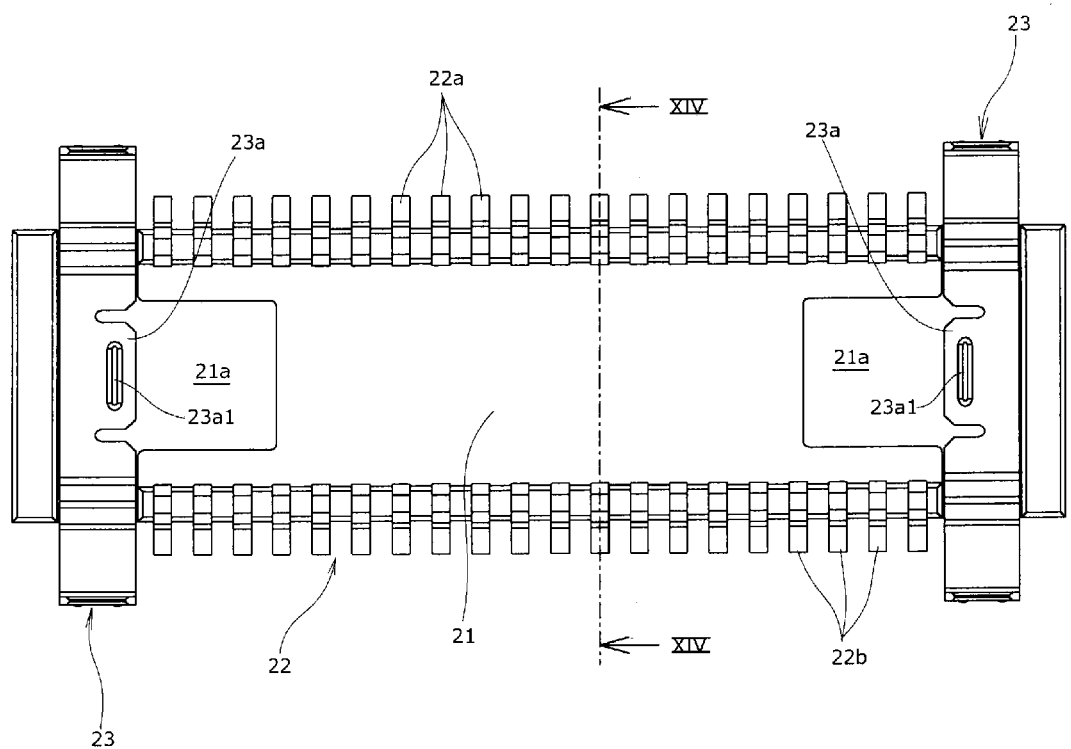
FIG. 13 is an explanatory plan view showing the single second electrical connector (plug connector) according to the embodiment of the present invention shown in FIG. 11 and FIG. 12.
Figure 14:
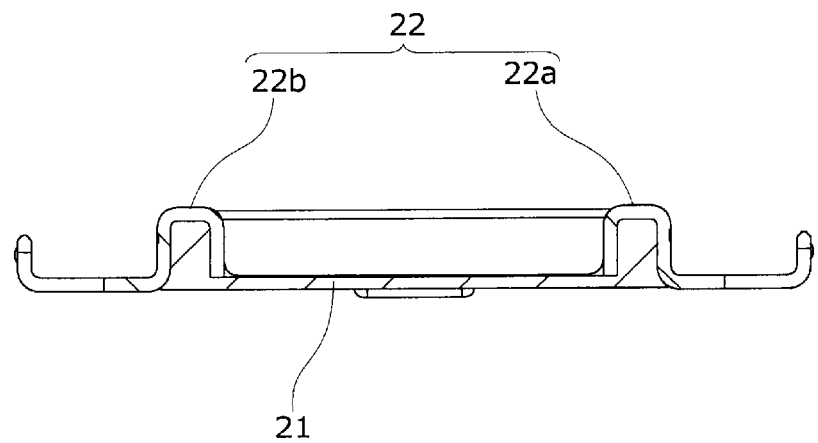
FIG. 14 is an explanatory transverse cross-sectional view taken along a line XIV-XIV in FIG. 13.

On the other hand, particularly as shown in FIG. 7, the movable lock engagement part 13b is formed by a thin-plate-shaped metal member having a saddle shape and is formed into a shape which is bent so as to form an approximately rectangular shape in the front side that surrounds the outer peripheral surface of the above described lock guide part 13a. A space part having an approximately rectangular shape in the front side is formed in the inner side of the movable lock engagement part 13b, and the inner-side space of the movable lock engagement part 13b is configured to be inserted to the outer side of the above described lock guide part 13a in a loosely mated state.

Attachment of the movable lock engagement part 13b like this is carried out by inserting the movable lock engagement part 13b to a later-described attachment space part 13c, which is formed at a root part of the lock guide part 13a, from the upper side, and, when the movable lock engagement part 13b inserted in the attachment space part 13c is moved toward the lock guide part 13a, attachment of the movable lock engagement part 13b is carried out.

For attachment of the movable lock engagement part 13b like this, a dividing slit part 13b1 extending in the "connector longitudinal direction" is formed in a bottom part of the movable lock engagement part 13b. This dividing slit part 13b1 is for inserting a narrow partition plate 13a2 of the later-described attachment space part 13c in the top-bottom direction. When the movable lock engagement part 13b is moved down toward the attachment space part 13c from the upper side, the narrow partition plate 13a2 of the attachment space part 13c is inserted in the dividing slit part 13b1; thus, attachment of the movable lock engagement part 13b is configured to be carried out. This point will be described later.

After a state in which the movable lock engagement part 13b is once inserted in the attachment space part 13c is obtained, the movable lock engagement part 13b is moved toward the connector outer side, as a result, the movable lock engagement part 13b is moved onto the lock-guide-part-13a-side, and attachment of the movable lock engagement part 13b with respect to the lock guide part 13a is completed. This point will be also explained in detail in later paragraphs together with the structure of the above described attachment space part 13c.

As described above, the movable lock engagement part 13b is attached to the lock guide part 13a so as to be able to reciprocate. At one side of reciprocating-direction both-side edge parts of the movable lock engagement part 13b, more specifically, at the connector-outer-side edge part thereof, an engagement guiding part 13b2 extending obliquely upward from the upper surface of the movable lock engagement part 13b is formed. The engagement guiding part 13b2 is provided so as to be extended along the upper edge part of the movable lock engagement part 13b and has an engagement guiding function for the lock member 23 provided on the plug connector 20 serving as the second electrical connector as described later.

Herein, the attachment space part 13c for inserting the movable lock engagement part 13b from the upper side is provided to be continued to the root part of the above described lock guide part 13a, more specifically, to the part of the lock guide part 13a that is in the inner end side in the "connector longitudinal direction". The attachment space part 13c is provided so as to be dented to form an approximately rectangular shape in plane in the insulating housing 11 and is formed so as to be communicated with the connector inner end parts of the above described pair of sliding slit parts 13a1 and 13a1, and the movable lock engagement part 13b is configured to be inserted in the attachment space part 13c from the upper side in a loosely mated state.

Herein, the narrow partition plate 13a2 extending in the "connector longitudinal direction" is provided at the center part of the above described attachment space part 13c, and the attachment space part 13c is brought into a state that it is divided into two rooms in the "connector front-back direction" by the narrow partition plate 13a2. The narrow partition plate 13a2 is extended in the "connector longitudinal direction" from the connector-inner-end-side wall surface that forms the attachment space part 13c to the connector-inner-end-side wall surface of the above described lock guide part 13a, and the narrow partition plate 13a2 is formed so as to be narrower than the dividing slit part 13b1 of the above described movable lock engagement part 13b. When the movable lock engagement part 13b is inserted in the attachment space part 13c, the narrow partition plate 13a2 is brought into a state that it is inserted in the dividing slit part 13b1 of the movable lock engagement part 13b, the movable lock engagement part 13b inserted in the attachment space part 13c in this manner is moved toward the connector outer side and is moved onto the lock guide part 13a to carry out attachment of the movable lock engagement part 13b.

At a bottom-side (lower-side) open part of the above described attachment space part 13c, positioning parts 13d which define the moving range of the movable lock engagement part 13b are integrally provided with the insulating housing 11. The positioning part 13d is formed by an elastic member extending in a cantilever shape from the connector-inner-side wall surface of the attachment space part 13c toward the connector outer side, and the paired positioning parts 13d are disposed in both sides sandwiching the above described narrow partition plate 13a2, respectively. Each of the positioning parts 13d is provided so as to be positioned in a somewhat lower side of the above described lock guide part 13a, and the extending-direction end face of the positioning part 13d, in other words, the connector-outer-side free end face thereof is disposed so as to be at approximately the same position as the end face of the lock guide part 13a in the "connector longitudinal direction".

In the above described manner, the movable lock engagement part 13b inserted into the inner side of the attachment space part 13c is once received by the upper surfaces of both of the positioning parts 13d and 13d, and the positioning parts 13d are elastically displaced to the lower side by the pressing force toward the lower side with respect to the movable lock engagement part 13b. When the movable lock engagement part 13b is moved down along the elastic displacement of the positioning parts 13d to the position facing the lock guide part 13a, the movable lock engagement part 13b is moved to the connector outer side toward the lock guide part 13a, and the movable lock engagement part 13b is attached to the outer side of the lock guide part 13a.

When the movable lock engagement part 13b in the upper side of the positioning parts 13d is moved onto the lock-guide-part-13a side in this manner, the positioning parts 13d become an open state and are displaced to be moved up to return to the original positions thereof. The distal end parts of the positioning parts 13d, which have been displaced to be moved up and returned to the original positions, became a state that they face the movable lock engagement part 13b, which has been moved to the lock guide part 13a in the above described manner. The positioning parts 13d, which have become such a returned state, have a function as a stopper with respect to the movable lock engagement part 13b so that the maximum moving range of the movable lock engagement part 13b, particularly the movement toward the connector inner side, is defined by the positioning parts 13d.

The moving range of the movable lock engagement part 13b in the connector outer side is defined when the movable lock engagement parts 13b abut the ends of the sliding slit parts 13a1 and 13a1 provided in both sides of the above described lock guide part 13a. A triangular indication mark showing the position of the movable lock engagement part 13b is formed on the upper-side surface of the movable lock engagement part 13b so that the moved position of the movable lock engagement part 13b can be visually checked.

[About Lock Member of Second Electrical Connector]

On the other hand, a pair of housing-operation openings 21a and 21a having approximately rectangular shapes in a plane (square shapes) are formed to penetrate through the "connector-longitudinal-direction" both end parts of the insulating housing 21 provided in the plug connector 20 as the above described second electrical connector. The housing-operation opening 21a is formed so as to have a size that exposes the lock guide part 13a, the movable lock engagement part 13b, the attachment space part 13c, and the positioning part 13d constituting the lock member 13 toward the mating-direction outer side upon mating with the above described receptacle connector 10.

At each of the housing-operation openings 21a, the lock member 23 consisting of a thin-plate metal member having a band-plate shape is attached so as to be extended in the "connector front-back direction" in the region of the housing-operation opening 21a corresponding to the connector outer side. The lock member 23 is disposed so as to be extended from the inner-side region of the insulating housing 11 toward both sides of the "connector front-back direction" outer-side regions and is fixed to the "connector-front-back-direction" both edge parts of the insulating housing 21 by press-fitting or insert molding.

Furthermore, the lock member 23 is provided with a fixed lock latch part 23a having an approximately rectangular shape in a plane at the part approximately at the center thereof in the "connector front-back direction". The fixed lock latch part 23a is in an arrangement relation that it faces the lock guide part 13a of the above described receptacle connector 10 and is configured to be received by the lock guide part 13a of the receptacle connector 10 and abut the upper-side surface of the lock guide part 13a when both of the connectors 10 and 20 are mated with each other.

As shown in FIG. 21, when an operation of moving the movable lock engagement part 13b, which is provided on the receptacle connector 10 in the above described manner, to the connector outer side is carried out from the state in which the fixed lock latch part 23a in the plug-connector-20 side is abutting the upper side of the lock guide part 13a in the receptacle-connector-10 side, the movable lock latch part 13b of the receptacle connector 10 is moved so as to cover the fixed lock latch part 23a of the plug connector 20 from the upper side. As a result, the fixed lock latch part 23a of the plug connector 20 is sandwiched between the lock guide part 13a and the movable lock engagement part 13b of the receptacle connector 10, wherein the lock members 13 and 23 are configured to be changed to a mutually locked state.

When the movable lock engagement part 13b is operated to be moved to the connector inner side from the state in which the lock members 13 and 23 are mutually locked in the above described manner, the movable lock engagement part 13b is separated from the fixed lock latch part 23a, and the fixed lock latch part 23a becomes an open state and is changed to an unlocked state.

Figure 15:
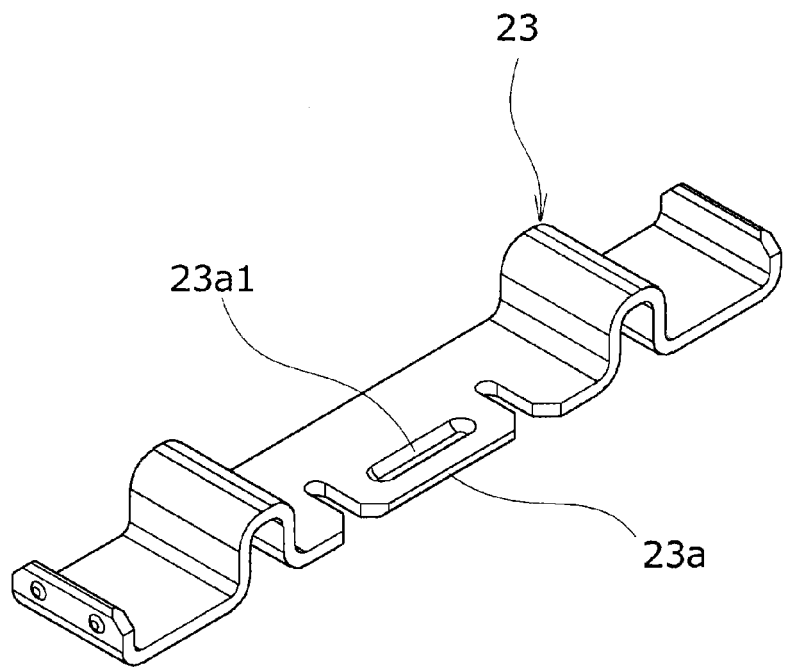
FIG. 15 is an external-appearance perspective explanatory view showing a lock member used in the second electrical connector (plug connector) according to the embodiment of the present invention shown in FIG. 11 to FIG. 14 from the connector inner side.
Figure 16:
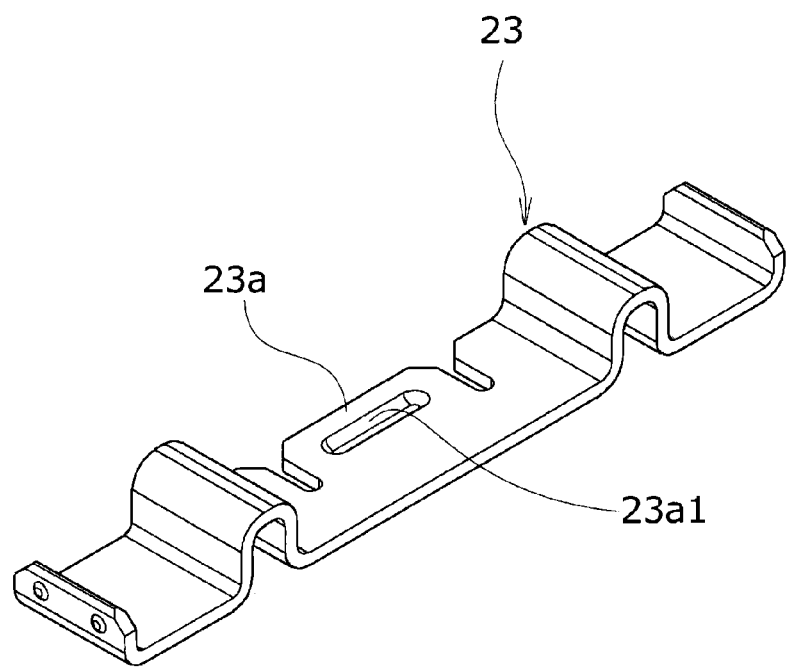
FIG. 16 is an external-appearance perspective explanatory view showing the lock member shown in FIG. 15 from the connector outer side.

As described above, the movable lock engagement part 13b in the receptacle-connector-10 side and the fixed lock latch part 23a in the plug-connector-20 side are in an arrangement relation that they become a mutually engaged state. As shown in FIG. 7B, FIG. 15, and FIG. 16, the movable lock engagement part 13b and the fixed lock latch part 23a thereof are provided with mating detection parts 13b3 and 23a1 consisting of concave/convex parts, which are mated with each other when they are engaged with each other. In the present embodiment, the mating detection part 13b3 in the movable-lock-engagement-part-13b side is formed to have a concave groove shape, and the mating detection part 23a1 in the fixed-lock-latch-part-23a side is formed to have a convex projection shape. When the movable lock engagement part 13b becomes an engaged state so as to cover the fixed lock latch part 23a from the upper side, both of the above described mating detection parts 13b3 and 23a1 are mated with each other, and, as a result, a so-called click feeling of mating can be obtained. Therefore, operability can be improved.

On the other hand, board-operation openings P2a and P2a having the positions and sizes approximately overlapped with the housing-operation openings 21a and 21a formed in the insulating housing 21 are formed to penetrate through the second wiring board P2 on which the above described plug connector 20 is mounted. The board-operation openings P2a are formed to have the size that exposes the lock guide part 13a, the movable lock engagement part 13b, the attachment space part 13c, and the positioning part 13d, which are constituting the lock member 13 of the plug connector 10, toward the outer side when both of the connectors 10 and 20 are mated with each other.

According to the board-connecting electrical connector device provided with such a configuration, the operation for engaging or releasing the movable lock engagement part 13b of the lock member 13 provided on the receptacle connector 10 with/from the fixed lock latch part 23a of the plug connector 20 is easily carried out in a state in which it is facing the electrical connector device which can be visually checked through the housing-operation opening 21a of the insulating housing 21 and the board-operation opening P2a of the second wiring board P2. Therefore, the operation of engagement/release about the lock members 13 and 23 and the check thereof can be easily reliably carried out.

In this case, particularly according to the present embodiment, the lock member 13 including the movable lock engagement part 13b does not stick out from the mounted region of the receptacle connector 10 and the disposed region of the electrode rows 12a and 12b. Therefore, the receptacle connector 10 can be reliably downsized. Similarly, the lock member 23 including the fixed lock latch part 23a does not stick out from the mounted region of the plug connector 20 and the disposed region of the electrode rows 22a and 22b. Therefore, the plug connector 20 can be reliably downsized.

Furthermore, the movable lock engagement part 13b in the present embodiment is configured to be moved along the longitudinal direction of the receptacle connector 10. Therefore, the operation of engaging or releasing the movable lock engagement part 13b of the lock member 13 with/from the fixed lock latch part 23a is easily carried out along the longitudinal direction of the electrical connector device having spatial allowance.

Hereinabove, the invention accomplished by the present inventor has been explained in detail based on the embodiment. However, the present embodiment is not limited to the above described embodiment, and it goes without saying that various modifications can be made within a range not departing from the gist thereof.

For example, the relation of the engagement/latch of the above described lock members 13 and 23 can be a disposition relation that is reversed between the receptacle connector 10 and the plug connector 20.

As described above, the present invention can be widely applied to various board-connecting electrical connector devices used in various electronic/electric devices.

What is claimed is:

1. A board-connecting electrical connector device for mutually mating a first electrical connector to which a first wiring board is coupled and a second electrical connector to which a second wiring board is coupled to electrically connect the first and second wiring boards with each other, the board-connecting electrical connector device configured to maintain the first and second electrical connectors in a mutually mated state by mutually engaging lock members provided on insulating housings of the first and second electrical connectors; wherein the lock member of either one of the first and second electrical connectors has a lock guide part provided on the insulating housing and a movable lock engagement part attached to the lock guide part so as to be able to reciprocate;

the lock member of the other one of the first and second electrical connectors has a fixed lock latch part attached to the insulating housing;

the fixed lock latch part has an arrangement relation that, when the first and second electrical connectors are mutually mated, the fixed lock latch part is overlapped with the lock guide part in the direction of the mating;

the movable lock engagement part is configured to be engaged or released with/from the fixed lock latch part when the movable lock engagement part is moved along the lock guide part from the state in which the fixed lock latch part is overlapped with the lock guide part; and at least one of the insulating housings of the first and second electrical connectors is provided with a housing-operation opening that brings the movable lock engagement part into an exposed state toward the outer side of the mating direction.

2. The board-connecting electrical connector device according to claim 1, wherein at least one of the first and second wiring boards is provided with a board-operation opening that brings the movable lock engagement part into an exposed state toward the outer side of the mating direction.

3. The board-connecting electrical connector device according to claim 1, wherein the movable lock engagement part is disposed in an inner side of a region in which the electrical connector is mounted with respect to the wiring board.

4. The board-connecting electrical connector device according to claim 1, wherein the first and second electrical connectors are provided with a pair of electrode rows consisting of a plurality of contact members aligned in a multipolar manner, and the movable lock engagement part is disposed between the pair of electrode rows.

5. The board-connecting electrical connector device according to claim 1, wherein the fixed lock latch part and the movable lock engagement part are formed by thin-plate-shaped metal members; and the movable lock engagement part and the fixed lock latch part are provided with mating detection parts consisting of concave/convex parts mutually mated upon the engagement.

6. The board-connecting electrical connector device according to claim 1, wherein the movable lock engagement part is configured to be moved along a longitudinal direction of the first and second electrical connectors.

7. The board-connecting electrical connector device according to claim 1, wherein a moving range of the movable lock engagement part is regulated by a positioning part integrally formed with the insulating housing so as to be elastically displaceable in the mating direction.

* * * * *